United States Patent [19]
Gow

[11] Patent Number: 5,475,562
[45] Date of Patent: Dec. 12, 1995

[54] STRUCTURE FOR COOLING AN EQUIPMENT ENCLOSURE

[75] Inventor: Thomas Gow, Dundee, Scotland

[73] Assignee: AT&T Global Information Solutions Company, Dayton, Ohio

[21] Appl. No.: 270,293

[22] Filed: Jul. 5, 1994

[30] Foreign Application Priority Data

Apr. 22, 1994 [GB] United Kingdom .................... 9408043

[51] Int. Cl.⁶ ..................................................... H05K 7/20
[52] U.S. Cl. .......................... 361/695; 165/122; 312/236; 454/184
[58] Field of Search ........................... 174/16.1; 454/184, 454/195; 165/80.3, 122, 126; 312/236; 361/679, 690, 692, 694, 695, 724, 814

[56]   References Cited

U.S. PATENT DOCUMENTS 4,122,508  10/1978  Rumbaugh .............................. 361/384
4,901,138   2/1990  Kushibiki ................................. 357/81
5,243,493   9/1993  Jeng ......................................... 361/690

FOREIGN PATENT DOCUMENTS 5055771  3/1993  Japan ..................................... 361/695
5152776  6/1993  Japan ..................................... 361/695

Primary Examiner—Gerald P. Tolin
Attorney, Agent, or Firm—Albert L. Sessler, Jr.

[57]   ABSTRACT

An enclosure (12) for electrical equipment (14) includes a fan mounted on an interior surface of the enclosure (12) and adapted to blow air outwardly from the enclosure (12) through a grille (24). The grille (24) includes a plurality of sets (90–96) of short, wide elongated slots, each set (90–96) having its slots disposed perpendicular to a radial direction of the fan hub (44) passing through the slots. The enclosure material between the slot sets (e.g. 90, 92) overlies struts (50) forming part of the support for the hub (44) carrying the fan blades. The construction provides low noise from air blown through the slots, while maintaining robust grille construction.

2 Claims, 3 Drawing Sheets

STRUCTURE FOR COOLING AN EQUIPMENT ENCLOSURE

BACKGROUND OF THE INVENTION

This invention relates to enclosures for housing equipment, such as electrical (including electronic) equipment.

Electrical equipment frequently generates heat during its operation. This generated heat can raise the temperature of the equipment, causing operational problems or malfunction of the equipment. Therefore, it is desirable to provide cooling means for cooling such equipment.

It is known to provide an enclosure for electrical equipment with an air-moving fan located within the enclosure, the fan being arranged to blow air outwardly through a grille provided in the material of the enclosure. This causes a current of air to be drawn into the enclosure, via openings in the enclosure and/or via another grille, and over the equipment, thereby cooling the equipment. The air blown outwardly by the fan through its grille tends to generate noise as it passes through the grille. If the enclosure containing the equipment is located in a noise-sensitive environment such as an office or a financial institution such as a bank, for example, then it is desirable to minimize any generated noise, including the aforementioned noise generated by air blowing outwardly through the grille.

Another problem associated with fan cooling arrangements is that the fan should be mounted so as to prevent or minimize possible personal injuries resulting from human contact with rapidly moving fan blades. For this purpose, it will be appreciated that a fan grille should be constructed both to have adequate strength and to prevent, or reduce the possibility of, a person's finger, for example, from contacting the moving fan blades.

SUMMARY OF THE INVENTION

Therefore, according to the present invention, there is provided an enclosure for housing electrical equipment, said enclosure having mounted therein an air-moving fan including a plurality of blades mounted on a rotatable hub, located adjacent to a grille region in said enclosure, characterized in that said grille region includes a plurality of sets of parallel, straight, elongated slots formed in said enclosure, the slots of each set being arranged to extend in a direction perpendicular to a radial direction of said hub passing through the slots of that set.

It will be appreciated that in an enclosure according to the present invention, the provision of a plurality of slots having the claimed configuration enables a grille pattern of short, wide, closely spaced slots to be achieved, thus permitting easy air flow, and hence low air noise, while enabling a robust grille construction to be achieved.

It is accordingly an object of the present invention to provide an enclosure for housing electrical equipment which is adapted to effect cooling of the equipment with a low noise level while having a robust structure.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
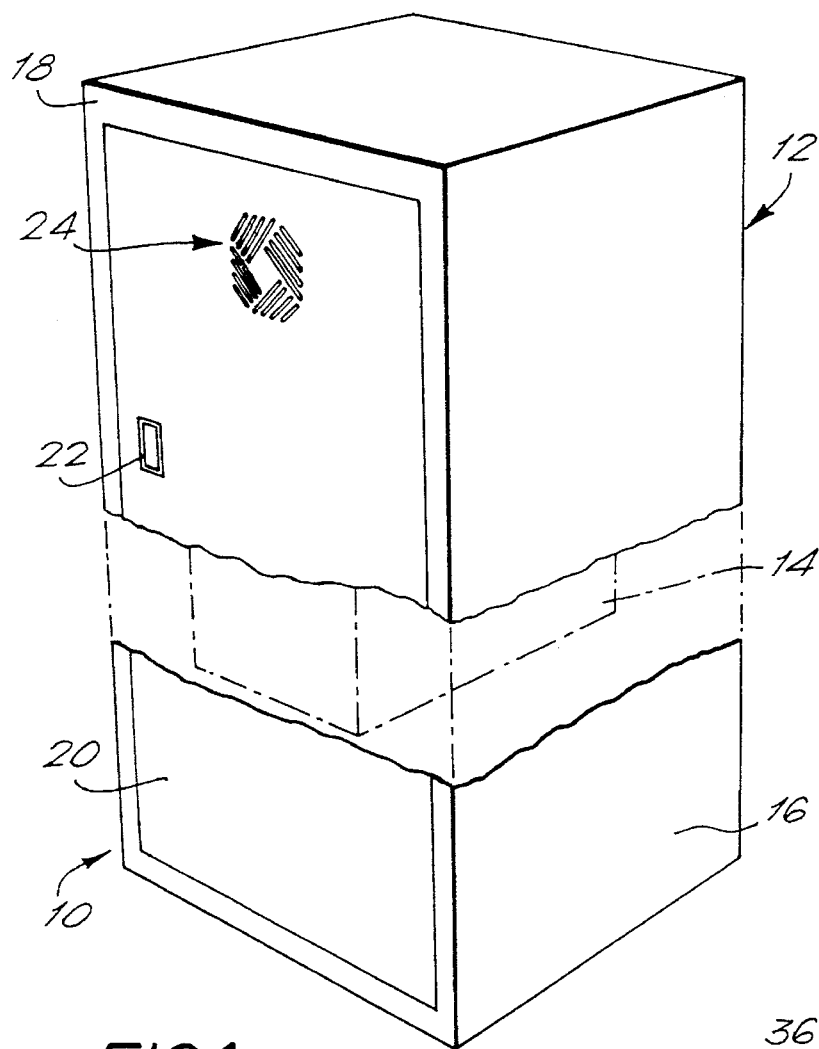
FIG. 1 is a perspective view of a cabinet containing equipment, with a portion of the cabinet structure broken away.

Referring first to FIG. 1, there is shown a schematic perspective view of apparatus 10 including an enclosure in the form of a cabinet 12 containing electrical equipment 14, shown schematically in dashed lines. The cabinet 12 is made of a metallic material and has a first wall 16, and a second wall (not shown) disposed opposite the first wall 16. The cabinet 12 has a third wall 18 containing an access door 20 having a handle 22 and mounted on hinges (not shown) supported by the cabinet 12.

In the preferred embodiment of the invention, the equipment 14 is ATM (automated teller machine) equipment. In this embodiment, the cabinet 12 is normally located in a wall or window of a financial institution such as a bank, with customer access to the equipment 14 being effected via a recessed region (not shown) in a cabinet wall opposite the wall 18 containing the access door 20.

It will be appreciated that the equipment 14, when operational, tends to generate heat. In order to prevent overheating and hence possible malfunction of the equipment 14, a cooling fan module 30 (not shown in FIG. 1) is mounted within the cabinet 14, adjacent a grille 24 provided in the upper portion of the door 20. The fan module 30 blows air outwardly through the grille 24. A further grille (not shown) may be provided in the lower portion of the door 20 to enable air to be drawn into the cabinet 12. If desired, a further fan (not shown) may be located within the cabinet 12, adjacent the further grille, to assist in drawing air into the cabinet 12. Air drawn into the cabinet 12 passes over the equipment 14 to effect cooling thereof, and exits through the grille 24. In one embodiment, the fan module supplies 120 cubic meters per hour of air, and rotates at 1900 revolutions per minute.

It will be appreciated that the rear portion of the cabinet 12, including the access door 20 containing the grille 24, is normally located within a lobby or office environment of the financial institution. Therefore, it is desirable to eliminate or reduce noise generated within the cabinet 12. One contributory factor to such noise is the noise generated by air blowing outwardly through the grille 24.

Referring now to FIGS. 2, 3, 4 and 5, the grille 24 and associated fan module 30 will be described in more detail. The fan module 30, which is preferably constructed of a plastic material, includes a support unit 32 and a blade unit 34. The support unit 32 includes spaced apart first and second support plates 36, 38 having central cut-away portions linked by a cylindrical portion 40, thereby forming a cylindrical aperture 42 within which the blade unit 34 of the fan module 30 is mounted and rotates.

The blade unit 34 includes a rotatably mounted hub member 44, driven by a motor (not shown), which is supported by a circular cylindrical central portion 46 of the support plate 38. The central portion 46 of the support plate 38 is supported by four struts 48, 50, 52 and 54, which extend between the central portion 46 and the outer portion of the support plate 38. The struts 48, 50, 52 and 54 extend tangentially (i.e. perpendicular to the radial direction) with respect to the central portion 46.

The blade unit 34 is provided with a plurality of blades 56, 58, 60, 62, 64, 66 and 68. In the preferred embodiment, the blade unit 34 has seven blades. However, this is not a restriction, and the number of blades may be smaller or greater than seven.

Figure 2:
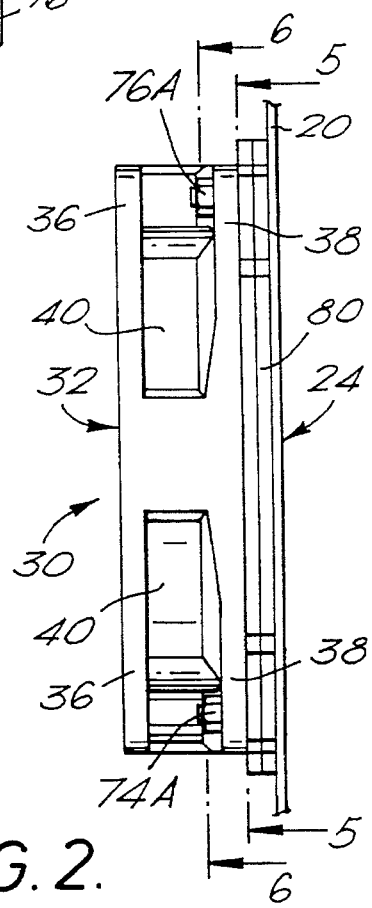
FIG. 2 is an end view of a fan module as mounted on an interior surface of the cabinet shown in FIG. 1.
Figure 3:
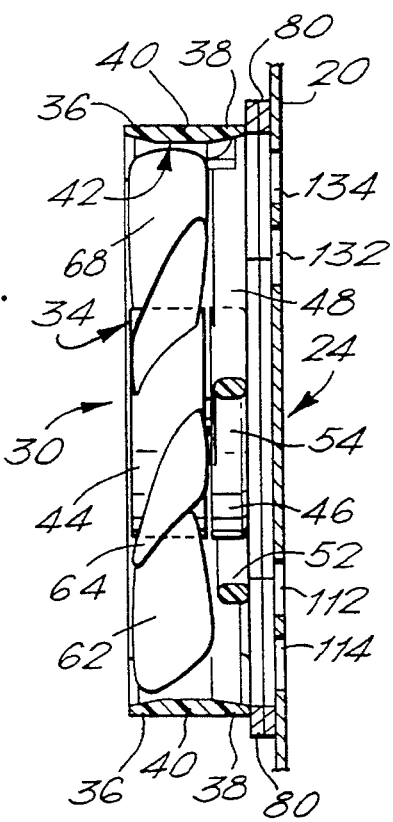
FIG. 3 is a central side view, partly in cross-section, of the fan module shown in FIG. 2.

The fan module 30 is secured to the interior side of the cabinet door 20 by means of studs 70, 72, 74 and 76, which pass through holes (not shown) provided in a pair of spacer plates 80 (FIGS. 2 and 3) and holes 82, 84, 86 and 88 provided in the support plate 38 (FIG. 5), and are secured by nuts such as the nuts 74A, 76A (FIG. 2). The outer ends of the studs 70–76 are flush with the outer surface of the door 20, so as to be substantially invisible from outside the cabinet 12. The spacer plates 80 may be formed of brass or plastic material, or of other suitable material.

Figure 4:
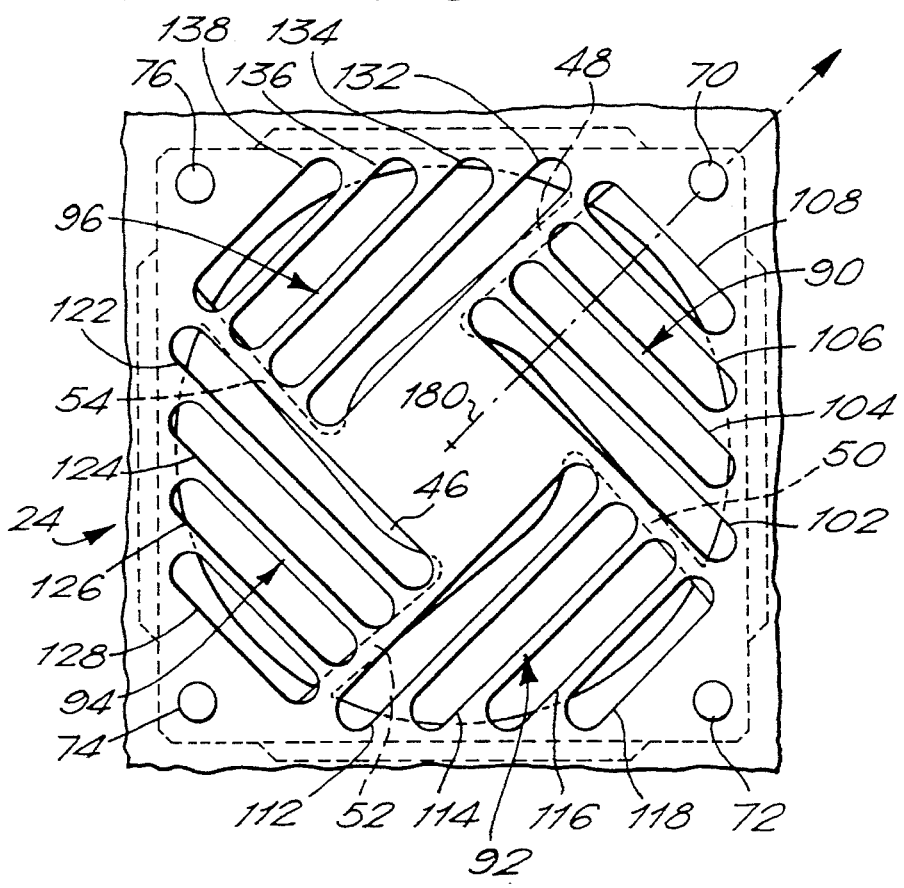
FIG. 4 is an exterior view of a grille provided in the cabinet surface adjacent to the fan module.
Figure 5:
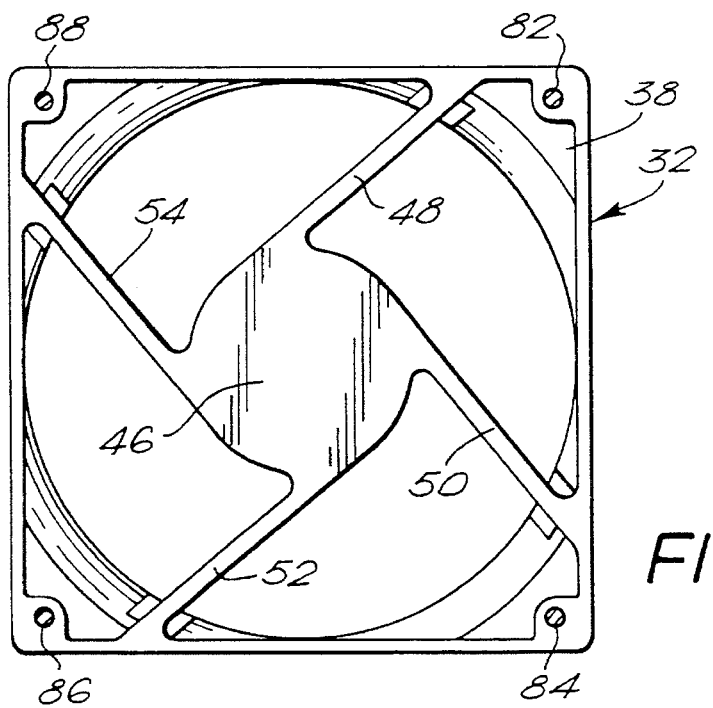
FIG. 5 is a plan view of the fan module looking in the direction of the arrows 5—5 in FIG. 2.
Figure 6:
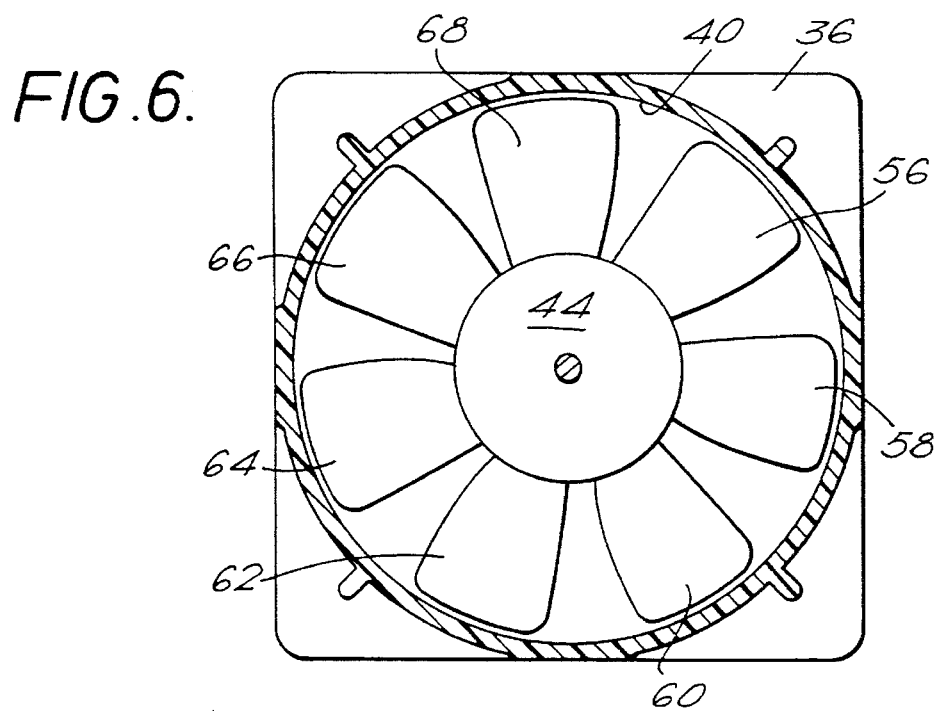
FIG. 6 is a plan view of the fan module looking in the direction of the arrows 6—6 shown in FIG. 2.

Referring now especially to FIG. 4, there is shown a front view of the grille 24 formed in the door 20 (FIG. 1). The grille 24 includes four sets 90, 92, 94 and 96 of slots. Each set of slots consists of four elongated parallel slots. Thus the set 90 includes parallel slots 102, 104, 106 and 108; the set 92 includes parallel slots 112, 114, 116 and 118; the set 94 includes parallel slots 122, 124, 126 and 128; and the set 96 includes parallel slots 132, 134, 136 and 138. Although each set 90–96 has four slots in the described embodiment, there may be a greater or lesser number of slots in each set.

It should be noted that each set of slots, such as the set 90, for example, is disposed such that the slots of the set are all perpendicular to a radial direction of the hub 44 (and central portion 46 of the support plate 38) passing through the slots. Thus, the slots of the set 90, for example, are disposed perpendicular to the radial direction arrow 180, FIG. 4. It is also to be noted that the lengths of the slots of each set decrease progressively from the innermost slot of each set to the outermost slot of each set. Thus, in the set 90, for example, the innermost slot 102 is longer than the adjacent slot 104, which is longer than the slot 106, which is longer than the outermost slot 108. With this arrangement, the slots substantially cover the area through which the blades 56–68 of the blade unit 34 rotate, but do not extend substantially beyond such area.

It will be appreciated that the slots 102–108, 112–118, 122–128 and 132–138 are all relatively short compared with a slot arrangement where a single set of slots parallel to a single direction (e.g. the vertical direction) covers the entire area of the grille. The short slot feature has the advantage that the slots can be relatively narrow, while maintaining adequately robust construction of the grille 24 so as to meet safety requirements, yet offering only low resistance to air flow, thereby assisting in a reduction in noise caused by such air flow through the slots.

A further feature of the grille 24 shown in FIG. 4 is that the material between adjacent sets of slots is aligned with struts 48, 50, 52 and 54, as can be seen in FIG. 4. Thus, the material between the sets 90 and 92 is aligned with the strut 50; the material between the sets 92 and 94 is aligned with the strut 52, etc. This feature has the advantage of further reducing the resistance to air flow, as compared with an arrangement, such as the above-mentioned arrangement of a single set of parallel slots covering the whole grid area, where the support struts would intercept air flow to the slots. This feature thus further reduces noise resulting from air flow, and also enhances the appearance of the structure, since the struts are not readily visible from outside the cabinet 12.

Yet another feature of the grille 24 is that the central portion of the grille is substantially aligned with the circular central portion 46 of the support plate 38. This further enhances the appearance of the structure, since the central support plate portion 46 is not readily visible from outside the cabinet 12.

Another advantage of the grille 24 is that since the elongated slots are all straight, they can be punched from the material of the door 20 using simple tooling material, as opposed to the cost of tooling equipment for punching out curved slots. In one embodiment, the material of the cabinet 12 is 1.25 millimeters thick, the width of the slots is 7.5 millimeters, the spacing between adjacent slots of a set is 3.5 millimeters, and the total thickness of the pair of spacer plates 80 is 5 millimeters.

Modifications of the described embodiment are possible. Thus, the fan module 30 could be mounted at other locations in the cabinet 12, rather than on the door 20 as shown in FIG. 1. For example, the fan module could be mounted in one of the side walls, such as the wall 16 (FIG. 1) with a grille corresponding to the grille 24 associated therewith. Also, a single spacer plate could be used instead of the pair of spacer plates 80. Furthermore, the invention is also applicable to other types of equipment, as well as to ATM equipment; for example, a PC (personal computer) console unit could be provided with a fan module and associated grille corresponding to the grille 24.

What is claimed is:

1. An enclosure for housing electrical equipment, comprising:
    a grille region having a plurality of sets of parallel, straight, elongated slots; and
    an air moving fan comprising a plurality of blades mounted on a rotatable hub and located adjacent to said grille region, the slots of each set of the grille region being arranged to extend in a direction perpendicular to a line extending radially from said hub and passing through the slots of that set; and
    support means for supporting said rotatable hub, said support means including a support plate having a central portion aligned with said hub and a plurality of struts extending from said central portion of said support plate, said grille region having material located between adjacent sets of said slots, the material located between adjacent sets of said slots being aligned with a respective one of said plurality of struts extending from said central portion of said support plate.

2. An enclosure according to claim 1, wherein said struts extend in a generally tangential direction from said central portion of said support plate.

* * * * *